(12) United States Patent
Honda et al.

(10) Patent No.: US 6,413,456 B1
(45) Date of Patent: Jul. 2, 2002

(54) METHOD FOR MANUFACTURING ELECTRONIC PARTS

(75) Inventors: Kazuyoshi Honda, Takatsuki; Noriyasu Echigo, Kobe; Masaru Odagiri, Kawanishi; Nobuki Sunagare, Matsue, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/216,153

(22) Filed: Dec. 18, 1998

(30) Foreign Application Priority Data

Dec. 25, 1997 (JP) .............................................. 9-357080

(51) Int. Cl.⁷ .......................... B29C 41/22; B29C 69/00
(52) U.S. Cl. .......................... 264/81; 264/255; 264/319; 427/124; 427/133
(58) Field of Search .......................... 264/81, 130, 134, 264/264, 254, 255, 265, 308, 319, 338; 427/124, 133

(56) References Cited

U.S. PATENT DOCUMENTS

| | | | |
|---|---|---|---|
| 4,237,086 A | * 12/1980 | Gehle | .......................... 264/130 |
| 4,857,482 A | * 8/1989 | Saito et al. | .................. 437/209 |
| 4,857,483 A | * 8/1989 | Steffen et al. | .............. 437/209 |
| 5,580,509 A | * 12/1996 | Van Den Berg et al. | .......................................................... 264/272.15 |
| 5,759,674 A | * 6/1998 | Furuta et al. | ............... 428/209 |

FOREIGN PATENT DOCUMENTS

| | | |
|---|---|---|
| EP | 0 492 962 | 1/1992 |
| JP | 3-241803 | 10/1991 |
| JP | 5-217797 | 8/1993 |

* cited by examiner

*Primary Examiner*—Angela Ortiz
(74) *Attorney, Agent, or Firm*—Merchant & Gould PC

(57) ABSTRACT

In a method for manufacturing electronic parts by laminating metal thin films and insulating thin films on a support, a mold releasing agent is applied to the support before the start of lamination. Alternatively, the mold releasing agent is applied to the surface of the laminate during the lamination step, and then lamination is resumed. Therefore, the laminate can be prevented from cracking when the laminate is separated from the support or divided into plural pieces in the lamination direction. Thus, the reliability and productivity of electronic parts improve.

11 Claims, 4 Drawing Sheets

METHOD FOR MANUFACTURING ELECTRONIC PARTS

FIELD OF THE INVENTION

The present invention relates to a method for manufacturing electronic parts and an apparatus for manufacturing thin films.

BACKGROUND OF THE INVENTION

Presently, thin films are used in a very wide range of products, for example, wrapping materials, magnetic tapes, capacitors, and semiconductors. Without these thin films, recent technologies for achieving a high performance and a small size cannot be explained. At the same time, various methods for forming a thin film have been developed to satisfy the industrial demands. For example, continuous taking-up vacuum evaporation, which is advantageous for high-speed mass production, is performed to manufacture thin films for use in wrapping paper, magnetic tapes, capacitors and the like.

In this case, a thin film having the desired properties can be formed by selecting an evaporation material and a substrate material according to the purpose of the thin film to be formed and, if necessary, introducing a reactive gas into a vacuum vessel and forming the thin film with an electric potential provided on the substrate. For example, in the manufacture of a magnetic recording medium, a long magnetic recording medium can be obtained by using an evaporation material comprising a magnetic element, such as Co, Ni, or Fe, and performing a reactive evaporation while introducing an oxygen-containing gas into the vacuum vessel.

In a semiconductor, a thin film is formed mainly by sputtering. Sputtering is effective especially for forming a thin film using a ceramic-based material. A ceramic thin film having a thickness of several $\mu$m or more is often formed by coating and firing. A ceramic thin film having a thickness of 1 $\mu$m or less is often formed by sputtering.

On the other hand, a coating method is used for forming a thin film using a resin material. Reverse coating or die coating is commercially used. In general, the coating of a material that is diluted with a solvent is performed, and then the material is dried for hardening. The lower limit of the thickness of the resin thin film formed by these methods is often around 1 $\mu$m though it depends on the material. A resin thin film having a smaller thickness is often difficult to obtain with these methods. Since the thickness of the coating film immediately after coating is several $\mu$m or more with a general coating process, diluting with a solvent is necessary for forming a very thin resin film, and a resin thin film having a thickness of 1 $\mu$m or less often cannot be obtained with such a process. Furthermore, diluting with a solvent is not preferable from the viewpoint of environmental protection in addition to the fact that defects easily occur in the coating film after drying. Accordingly, a method for forming a resin thin film without diluting with a solvent and a method for obtaining a very thin resin film stably are desired. As these methods, a method for forming a resin thin film under vacuum is proposed. With this method, a resin material is evaporated under vacuum and attached to a support. According to this method, a resin thin film without void defects can be formed, and diluting with a solvent is not necessary.

Various composite thin films, which cannot conventionally be obtained, can be obtained by laminating a ceramic or resin thin film and a different type of thin film. The industrial use field of the composite thin films is very diversified. Among them, chip-shaped electronic parts are very promising. Capacitors, coils, resistors, capacitive electric cells, or composite parts thereof, or the like can be formed with a very small size and a high performance by laminating thin films. The merchandizing and market expansion of these products have started already.

It is needless to say that electrodes are indispensable for obtaining electronic parts. In electronic parts using a metal thin film, a metal thin film having a different electric potential can be formed by patterning a metal thin film. That is, complicated electronic parts can be formed by dividing a metal thin film into plural portions with patterning portions (portions where the metal thin film is not formed) defined as insulation regions and laminating the metal thin film and an insulating thin film.

FIG. 4 is a schematic view of an example of an apparatus for manufacturing electronic parts by laminating thin films. As shown in FIG. 4, a device 8 for manufacturing a metal thin film, a device 9 for manufacturing an insulating thin film made of a resin material or the like, a patterning material-applying device 11 for patterning the metal thin film, and the like are located around a cylindrical cooling can 7. These devices are housed in a vacuum vessel 5 and maintained at a predetermined degree of vacuum by an evacuation system 6 comprising a suction pump or the like. Then, a thin film laminate in which insulating thin films and patterned metal thin films are alternately laminated is formed on the outer periphery of the cooling can 7 by rotating the cooling can 7 in the arrow direction. In FIG. 4, the reference numeral 10 denotes a hardening device for hardening the insulating thin film to a predetermined hardness, and the reference numeral 12 denotes a patterning material-removing device for removing the extra patterning material after forming the metal thin film.

The thus formed thin film laminate is separated from the cooling can 7. Then, the laminate is cut to a required size for each electronic part and provided with external electrodes to form many electronic parts.

In addition, a method called oil margin or the like can be used to obtain the patterned metal thin film. This method utilizes the fact that the metal thin film is not formed on the patterning material when the metal thin film is formed by evaporation or the like after previously forming the patterning material thinly. In the thus formed metal thin film, the patterning portions are removed. Therefore, a metal thin film having the desired pattern can be formed. For example, many capacitors having a cross-sectional structure as shown in FIG. 3 can be obtained by switching the patterning position when repeating the alternate lamination of the metal thin film and the resin thin film with the apparatus as shown in FIG. 4, and cutting the laminate later.

However, the yield of electronic parts obtained by the above methods decreases because of defects such as cracking that occurs when the thin film laminate is separated from the support such as a can. In addition, such cracking deteriorates the reliability of the electronic parts significantly. Furthermore, the operation of the apparatus should be stopped and the vacuum atmosphere lost every time the thin film laminate is separated from the support. Therefore, the rate of film-forming operation of the apparatus decreases.

SUMMARY OF THE INVENTION

In order to solve the above problems in the conventional methods for manufacturing a thin film laminate for electronic parts, it is an object of the present invention to provide a method for manufacturing electronic parts that provide a high productivity and a high reliability. It is another object of the present invention to provide a manufacturing apparatus that can manufacture a highly reliable thin film laminate with a good productivity.

In order to achieve the above objects, a method for manufacturing electronic parts according to a first aspect of the present invention includes the steps of forming a laminated thin film on a support to which a mold releasing agent is previously applied and separating the laminated thin film from the support. According to the first aspect, since the mold releasing agent is applied to the support before forming the laminated thin film on the support, damage such as cracking is avoided in the laminated thin film when separating the laminated thin film from the support after forming the laminated thin film. Thus, electronic parts can be provided in a high yield and with high reliability. Accordingly, the manufacturing method of the present invention is suitable for the mass production of high-performance electronic parts including high-performance capacitors.

In the first aspect, when a plurality of the laminated thin films are laminated, a mold releasing agent may be applied to the surface of the laminated thin film during the lamination. According to this aspect, more laminated thin films for electronic parts can be obtained in a continuous lamination step by laminating a predetermined number of the laminated thin films and separating the laminated thin films at the surface to which the mold releasing agent is applied. In addition, damage such as cracking is avoided during the separation. Therefore, highly reliable electronic parts can be manufactured with a better productivity.

A method for manufacturing electronic parts according to a second aspect of the present invention is a method for manufacturing electronic parts having at least a metal thin film and an insulating thin film, including the steps of laminating two or more of the metal thin films and two or more of the insulating thin films on a support to form a laminate and separating the laminate in the thickness direction. According to the second aspect, since a plurality of laminates for electronic parts can be laminated in the thickness direction, the productivity of electronic parts improves. Thus, the present invention is suitable for the mass production of high-performance electronic parts including high-performance capacitors.

In the second aspect, it is preferable that a mold releasing agent is applied after laminating a predetermined number of the metal thin films and the insulating thin films and that a predetermined number of the metal thin films and the insulating thin films are further laminated. According to the preferable aspect, damage such as cracking is avoided during the separation of the laminate by applying the mold releasing agent to the separation surface. Therefore, electronic parts can be provided in a high yield with high reliability.

In the second aspect, it is preferable that the manufacturing method further includes the step of applying a mold releasing agent to the support prior to the step of forming the laminate. According to the preferable aspect, since the mold releasing agent is applied to the support, damage such as cracking does not occur in the laminate when separating the laminate from the support. Thus, electronic parts can be provided in a high yield with high reliability.

In the second aspect, it is preferable that the metal thin films and the insulating thin films are continuously formed under vacuum without destroying a vacuum atmosphere. In addition, it is preferable that the formation of the metal thin films and the insulating thin films and the application of the mold releasing agent are continuously performed under vacuum without destroying a vacuum atmosphere. Here, destroying a vacuum atmosphere means that the operation of returning to the atmospheric pressure is not performed and does not include a permissible decrease (fluctuation) in the degree of vacuum. According to the preferable aspect, electronic parts can be manufactured with a good productivity. In addition, since the oxidation of the metal thin films and the contamination of foreign substances into the laminate, which are caused by destroying the vacuum atmosphere, can be prevented, the decrease of the yield can be prevented, and highly reliable electronic parts can be obtained.

In the first and the second aspect, it is preferable that the application of the mold releasing agent is performed by a process selected from the group consisting of evaporation, spraying, sputtering, and a combination thereof. According to the preferable aspect, since the application of the mold releasing agent can be performed stably and reliably, the laminate can be separated easily. Thus, the decrease of the yield can be prevented, and highly reliable electronic parts can be obtained.

An apparatus for manufacturing a thin film according to the present invention includes a vacuum vessel, a vacuum pump for maintaining a predetermined degree of vacuum in the vacuum vessel, a support located in the vacuum vessel, a metal thin film-forming device for forming a metal thin film directly or indirectly on the support, an insulating thin film-forming device for forming an insulating thin film directly or indirectly on the support, and a mold releasing agent-applying device for applying a mold releasing agent to the surface of at least one of the support, a formed metal thin film, and a formed insulating thin film. According to this aspect, since the manufacturing apparatus includes the mold releasing agent-applying device for applying a mold releasing agent to the surface of the support, the metal thin film, or the insulating thin film, the mold releasing agent can be applied before or during lamination. Thus, the obtained thin film laminate can be separated easily from the support, or the laminate can be divided easily in the thickness direction. Damage such as cracking in the laminate during the separation or the division is avoided. Accordingly, a highly reliable thin film laminate can be manufactured efficiently.

DETAILED DESCRIPTION OF THE INVENTION

An embodiment of the present invention will be described below with reference to the drawings.

Figure 1:
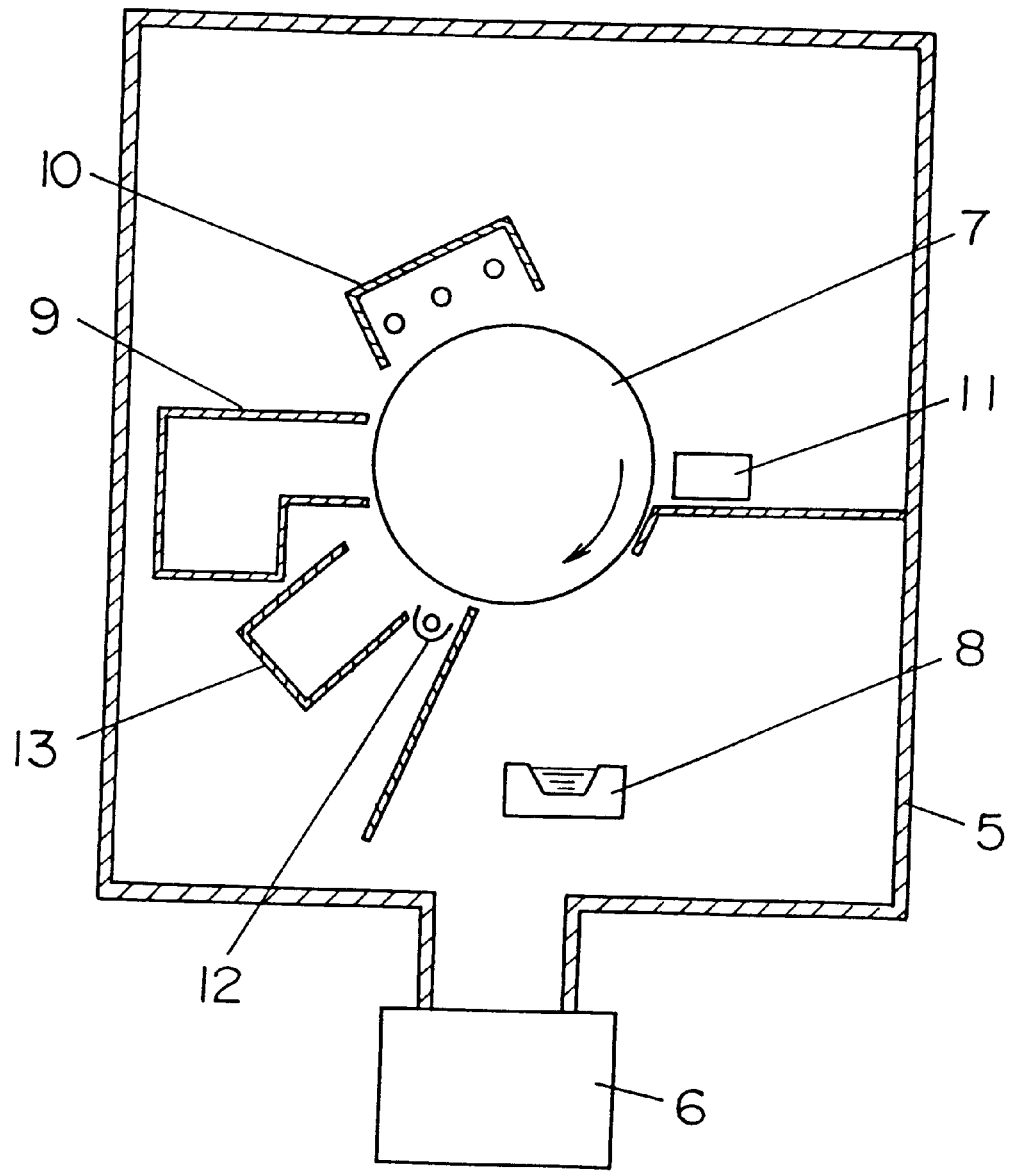
FIG. 1 is a schematic cross-sectional view of an example of an apparatus for manufacturing thin films for carrying out a method for manufacturing electronic parts according to an embodiment of the present invention.

FIG. 1 shows a schematic view of an apparatus for manufacturing a multilayer laminate for electronic parts comprising metal thin films and insulating thin films.

As shown in FIG. 1, a metal thin film-forming source 8, an insulating thin film-forming source 9, a hardening device 10, a patterning material-applying device 11, a patterning material-removing device 12, and a mold releasing agent-applying device 13 are located around a laminated film-supporting can 7 that is cylindrical and is cooled to a predetermined temperature. By rotating the can 7 in the arrow direction, a thin film laminate in which metal thin films and insulating thin films are alternately laminated is formed on the outer periphery of the can 7. The number of the lamination layers corresponds to the number of rotations of the can 7.

As the metal thin film-forming source 8, a resistance heating evaporation source, an induction heating evaporation source, an electron beam evaporation source, a sputtering evaporation source, a cluster evaporation source, other devices used for forming a thin film, or a combination of these can be used according to the metal thin film to be formed.

As the insulating thin film-forming source 9, a device can be selected properly according to the insulating thin film to be formed. For example, when a resin-based material is used as the insulating thin film, a heater, a vaporizer or atomizer using ultrasonic waves or spraying, or the like can be used. When a ceramic-based material is used as the insulating thin film, a sputtering device or the like can be used. When a metal oxide is used as the insulating thin film, a sputtering device, an evaporation device or the like for oxide can be used.

The hardening device 10 hardens the insulating thin film to a predetermined hardness, and a device can be selected properly according to the insulating thin film to be formed. For example, when a resin thin film is formed as the insulating thin film, an ultraviolet ray hardening device, an electron beam hardening device, a thermohardening device, or a combination of these can be used.

The patterning material-applying device 11 patterns the metal thin film. For example, an oil margin method, in which oil or the like is applied thinly into a predetermined shape before forming the metal thin film, can be employed.

As the patterning material, various oils including a hydrocarbon-based oil, a mineral oil, and a fluorine-based oil, or other materials suitable for the metal thin film to be formed can be used. As the method for applying the patterning material, coating or a method corresponding to the coating (a contact method), or a method for confining the patterning material in a closed nozzle having a minute opening corresponding to the pattern, heating the patterning material, and spouting the vapor of the material from the opening so that the vapor coheres on the surface for forming the metal thin film (a non-contact method) can be used.

The position where the patterning material is applied in the width direction (the direction perpendicular to the face of the sheet of FIG. 1) is preferably movable according to the rotation of the can 7. Thus, a thin film laminate, in which the pattern position of the metal thin film is different for each layer, can be obtained.

The patterning material-removing device 12 removes the extra patterning material after forming the metal thin film. The removing system can be selected according to the type of the patterning material. For example, a removing method using heating with light, such as far-infrared rays or infrared rays, or heating with an electric heater, or a removing method using decomposition with plasma irradiation, ion irradiation, electron beam irradiation or the like can be used.

The mold releasing agent-applying device 13 applies a mold releasing agent to the outer periphery of the can 7 before manufacturing the laminate, and the metal thin film or the insulating thin film while manufacturing the laminate. The mold releasing agent is not particularly limited and can be selected properly according to the materials of the metal thin film and the insulating thin film, and the like. In addition, the method for applying the mold releasing agent is not particularly limited and can be selected according to the mold releasing agent to be used, and the like.

These devices are housed in a vacuum vessel 5 and maintained at a predetermined degree of vacuum by an evacuation system 6 comprising a suction pump or the like.

Figure 2:
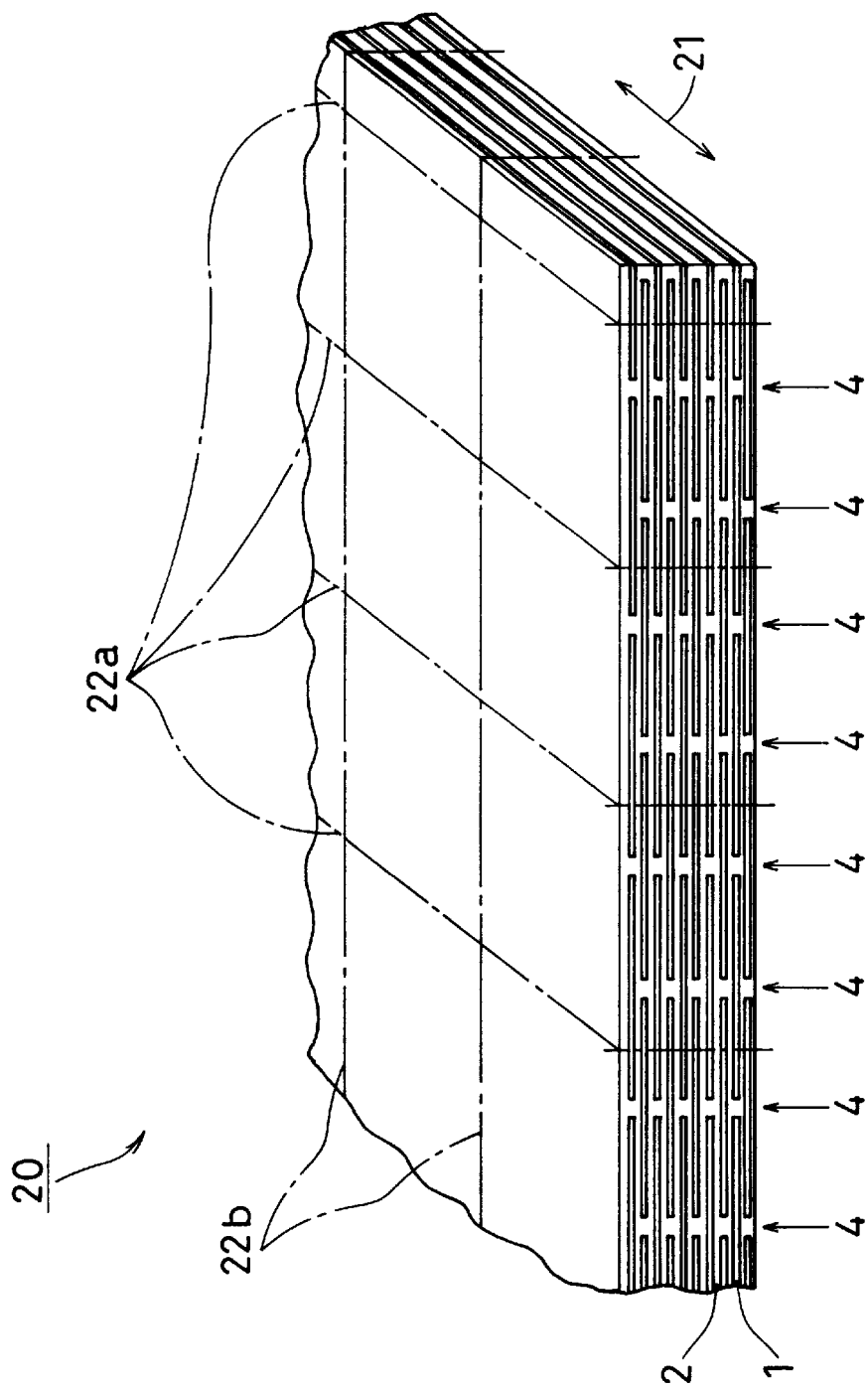
FIG. 2 is a schematic perspective view of an example of a laminate base element.

A multilayer thin film laminate having a cylindrical shape, in which patterned metal thin films and insulating thin films are alternately laminated, can be formed on the outer periphery of the can 7 by the above devices. Then, the laminate is removed by radially dividing the laminate, for example, into 8 pieces (cutting the laminate for each 45°). The laminate pieces are pressed and expanded into a flat sheet under heating. FIG. 2 shows a schematic perspective view of an example of the thus obtained laminate base element 20 comprising insulating thin films and metal thin films. In FIG. 2, an arrow 21 indicates the moving direction of the outer periphery of the can 7. As shown in FIG. 2, many patterned metal thin films 1 and insulating thin films 2 are laminated in the laminate base element 20. The reference numeral 4 denotes the pattern position of the metal thin film 1. In FIG. 2, the lamination is simplified for the purpose of illustration, and the number of lamination layers is much fewer than that of the actual lamination layers.

For example, in manufacturing capacitors, the laminate base element 20 is cut at cutting planes 22a, and external electrodes are formed on the cutting planes by spraying brass, or the like. Then, the laminate base element 20 is cut at the positions corresponding to cutting planes 22b in FIG. 2, and the outer surface is coated to obtain a chip capacitor as shown in FIG. 3.

Figure 3:
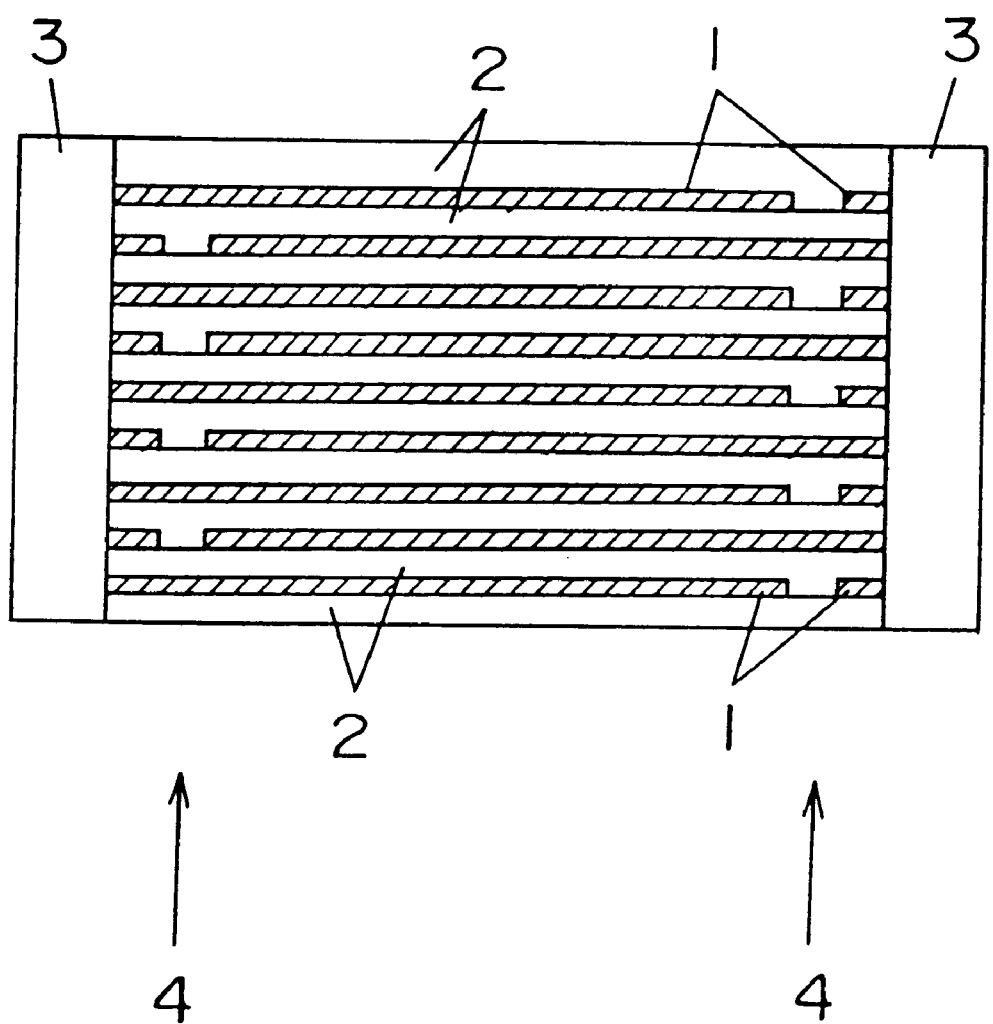
FIG. 3 is a schematic cross-sectional view of an example of an electronic part in the embodiment of the present invention.
Figure 4:
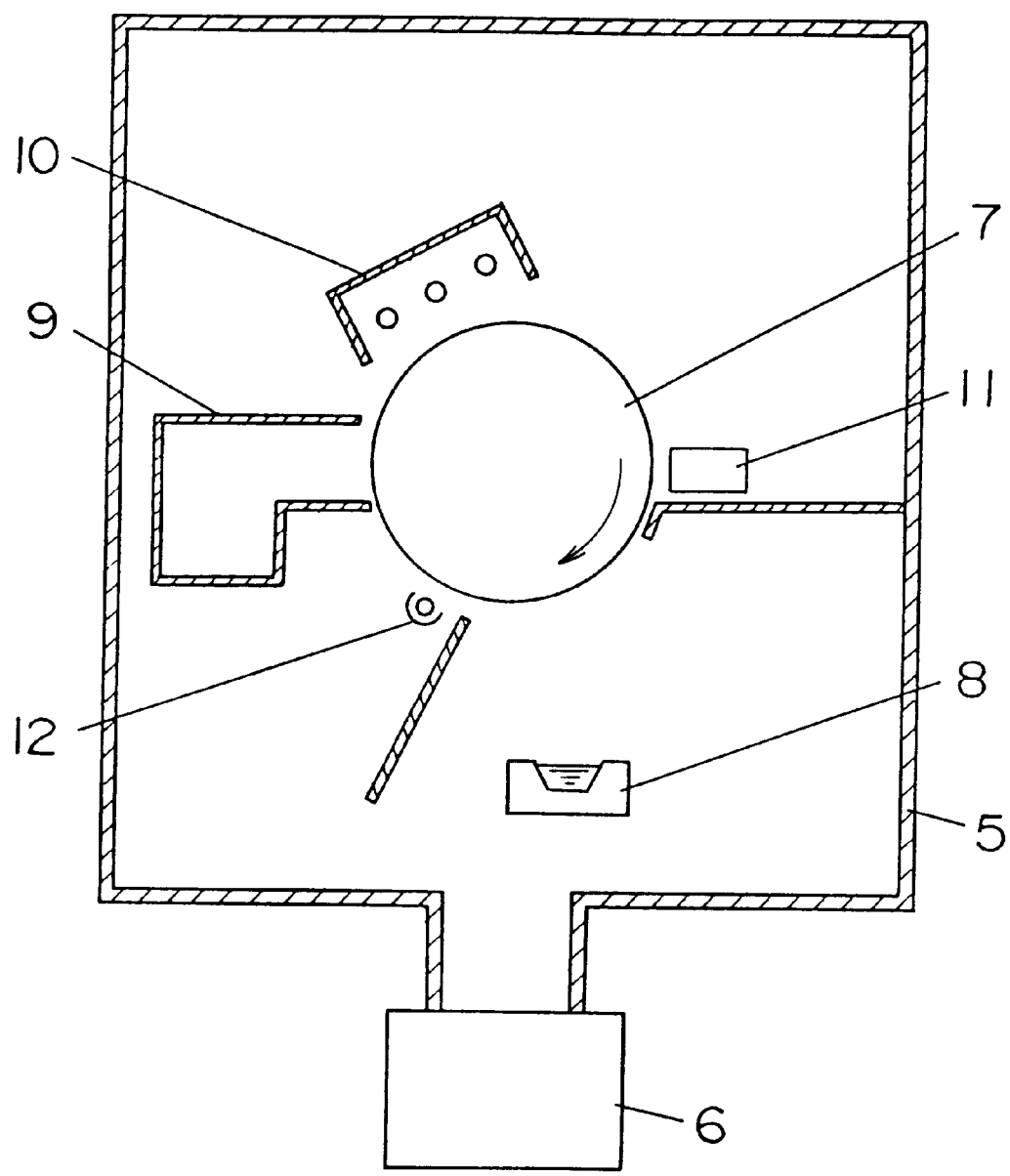
FIG. 4 is a schematic cross-sectional view of an example of an apparatus for manufacturing thin films according to the prior art.

In FIG. 3, the reference numeral 1 denotes a metal thin film, the reference numeral 2 denotes an insulating thin film, the reference numeral 3 denotes an external electrode electrically connected to the metal thin film 1, and the reference numeral 4 denotes the pattern position of the metal thin film 1.

According to the present invention, the laminate can be separated easily from the can 7 without damaging the laminate by previously applying the mold releasing agent to the surface of the can 7.

In addition, the laminate is easily divided into plural pieces at a surface to which the mold releasing agent is applied, by applying the mold releasing agent after the can 7 is rotated for a predetermined number of rotations after starting the lamination and then further continuing the lamination. Therefore, laminates for electronic parts can be manufactured by laminating a predetermined number of laminates in the thickness direction, thereby improving the productivity dramatically. Also, since the mold releasing agent is applied, the laminate is not damaged when dividing the laminate. In addition, the laminate may be separated in the thickness direction at any time. However, in the case of forming external electrodes, the laminate is preferably separated before forming the external electrodes because separation is difficult once the external electrodes are formed.

In the above description, the laminate is subjected to treatments, such as cutting and the formation of the external electrodes, after separating the laminate from the can 7. However, these steps can be changed properly according to the type of electronic parts. Also, it is possible to form electronic parts without these after-treatments depending on the type of electronic parts.

FIG. 1 shows one method for forming a multilayer laminate comprising metal thin films and insulating thin films. The scope of the present invention is not restricted by the method of FIG. 1.

EXAMPLE 1

A laminate for capacitors was manufactured by using the apparatus shown in FIG. 1.

An evaporated aluminum thin film was formed on the can 7 as a metal thin film, and an acrylate resin thin film was formed on the can 7 as a dielectric thin film by heater heating and vaporization. At this time, the resin thin film was hardened by irradiation with ultraviolet rays, and the metal thin film was patterned into a predetermined shape by an oil patterning method. After a predetermined number of laminations, the resulting laminate was separated from the can 7 to obtain a laminate base element 20 as shown in FIG. 2. Then, the laminate base element 20 was subjected to after-treatments, such as cutting and the formation of external electrodes, to obtain capacitors. FIG. 3 shows a schematic view of a cross section of the obtained capacitor.

The thickness of the aluminum thin film was 50 nm, and the thickness of the resin thin film was 1 $\mu$m. As the resin material, 1.9 nonanediol diacrylate mixed with 5 wt % of a photoinitiator was used. The number of laminations for each of the aluminum thin film and the resin thin film was about 1,000. The width of an insulation portion formed by patterning was about 0.5 mm. A fluorine-containing oil was used as the patterning material. The distance between the centers of adjacent patterning insulation portions on a lamination surface was 2.5 mm. A far-infrared ray heater was used to remove the patterning material. Prior to the start of lamination, a spray of a fluorine-based mold releasing agent (DAIFREE GA-6010 manufactured by DAIKIN INDUSTRIES, LTD.) was provided on the outer periphery of the cylindrical can in the air, and spread thinner using a nonwoven fabric impregnated with alcohol. After forming about 1,000 aluminum thin films and about 1,000 resin thin films, the laminate was separated from the cylindrical can, and pressed flat at 100° C. Then, cutting, the formation of external electrodes by thermal spraying, and the like were performed to form capacitors.

Comparative Example 1

Lamination and the formation of capacitors were performed in the same method as in Example 1 except that the mold releasing agent was not applied to the outer periphery of the can.

Among the capacitors formed by the methods of Example 1 and Comparative Example 1, the proportion of apparently failed capacitors due to cracking during the separation from the can and capacitors that have the shape of a capacitor but have a capacity error of 30% or more with respect to the designed value is shown in Table 1 as a failure rate with respect to the designed number of capacitors to be obtained.

TABLE 1

Comparison of Failure Rate

|  | Example 1 | Comparative Example 1 |
| --- | --- | --- |
| Cracking during separation from the can | 4% | 35% |
| Capacity error of 30% or more | 2% | 20% |
| Total failure rate | 6% | 55% |

The result of Table 1 indicates that the apparent cracking failure of the laminate and a minute cracking failure inside the laminate that appeared as an abnormal capacity, both of which occurred in Comparative Example 1, improve significantly in Example 1. This is considered to be caused by the fact that an excessive force is not applied to the laminate during the separation of the laminate by applying the mold releasing agent previously.

EXAMPLE 2

A laminate for capacitors was manufactured by using the apparatus shown in FIG. 1.

An evaporated aluminum thin film was formed on the can 7 as a metal thin film, and an acrylate resin thin film was formed on the can 7 as a dielectric thin film by heater heating and vaporization. At this time, the resin thin film was hardened by irradiation with ultraviolet rays, and the metal thin film was patterned into a predetermined shape by an oil patterning method. After a predetermined number of laminations, the resulting laminate was separated from the can 7 to obtain a laminate base element 20 as shown in FIG. 2. Then, the laminate base element 20 was subjected to after-treatments, such as cutting and the formation of external electrodes, to obtain capacitors. FIG. 3 shows a schematic view of a cross section of the obtained capacitor.

The thickness of the aluminum thin film was 50 nm, and the thickness of the resin thin film was 1 $\mu$m. As the resin material, 1.9 nonanediol diacrylate mixed with 5 wt % of a photoinitiator was used. The number of laminations for each of the aluminum thin film and the resin thin film was about 1,000. The width of an insulation portion formed by patterning was about 0.5 mm. A fluorine-containing oil was used as the patterning material. The distance between the centers of adjacent patterning insulation portions on a lamination surface was 2.5 mm. A far-infrared ray heater was used to remove the patterning material. Prior to the start of lamination, a spray of a fluorine-based mold releasing agent (DAIFREE GA-6010 manufactured by DAIKIN INDUSTRIES, LTD.) was provided on the outer periphery of the cylindrical can in the air, and spread thinner using a nonwoven fabric impregnated with alcohol. After forming about 1,000 aluminum thin films and about 1,000 resin thin films, a mold releasing agent was applied to the surface of the laminate by using a fluorine-based material as the mold releasing agent and RF sputtering the fluorine-based material. The sputtering power was 100 W. The formation of the aluminum thin film and the resin thin film was stopped during sputtering. Then, sputtering was stopped, and about 1,000 aluminum thin films and about 1,000 resin thin films were alternately laminated again. These steps were repeated to form about 4,000 aluminum thin films and about 4,000 resin thin films including three sputtered fluorine-based layers. The resulting laminate was separated from the cylindrical can, and pressed flat at 100° C. Then, the laminate was divided into four laminates by the borders of the sputtered fluorine-based layers. The divided laminates were subjected to treatments, such as cutting and the formation of external electrodes by thermal spraying, to form capacitors.

EXAMPLE 3

A laminate for capacitors was manufactured by using the apparatus shown in FIG. 1.

An evaporated copper thin film was formed on the can 7 as a metal thin film, and an acrylate resin thin film was formed on the can 7 as a dielectric thin film by heater heating and vaporization. At this time, the resin thin film was hardened by irradiation with an electron beam, and the metal thin film was patterned into a predetermined shape by an oil patterning method. After a predetermined number of laminations, the resulting laminate was separated from the can 7 to obtain a laminate base element 20 as shown in FIG. 2. Then, the laminate base element 20 was subjected to after-treatments, such as cutting and the formation of external electrodes, to obtain capacitors. FIG. 3 shows a schematic diagram of a cross section of the obtained capacitor.

The thickness of the copper thin film was 40 nm, and the thickness of the resin thin film was 0.1 $\mu$m. Dimethynoltricyclodecane diacrylate was used as the resin material. The number of laminations for each of the copper thin film and the resin thin film was about 4,000. The width of an insulation portion formed by patterning was about 0.1 mm. A mineral-based oil was used as the patterning material. The distance between the centers of adjacent patterning insulation portions on a lamination surface was 1.4 mm. In addition, an electron beam was used to remove the patterning material. Prior to the start of lamination, a spray of a fluorine-based mold releasing agent (DAIFREE GA-6010 manufactured by DAIKIN INDUSTRIES, LTD.) was provided on the outer periphery of the cylindrical can in the air, and spread thinner using a nonwoven fabric impregnated with alcohol. After forming about 4,000 copper thin films and about 4,000 resin thin films, the mold releasing agent was applied to the surface of the laminate while stopping the formation of the copper thin film and the resin thin film by providing a solenoid valve in the path to the spray nozzle for the commercial fluorine-based mold releasing agent (DAIFREE GA-6010 manufactured by DAIKIN INDUSTRIES, LTD.) and leading the nozzle into the vacuum vessel. The degree of vacuum was degraded temporarily by spraying. After the degree of vacuum was restored, the copper thin films and the resin thin films were laminated in the same manner again. Thus, a laminate comprising about 8,000 copper thin films and about 8,000 resin thin films and one mold releasing agent layer was obtained. The obtained laminate was separated from the cylindrical can and divided by the mold releasing agent surface. Then, the divided laminates were pressed flat at 120° C., and capacitors were formed in the same method as in Example 2.

Among the capacitors formed by the method of Example 1 without separation in the lamination direction and the capacitors formed by the methods of Examples 2 and 3 with separation in the lamination direction, the proportion of apparently failed capacitors due to cracking during the separation from the can or the division of the laminate and capacitors that have the shape of a capacitor but have a capacity error of 30% or more with respect to the designed value is shown in Table 2 as a failure rate with respect to the designed number of capacitors to be obtained.

TABLE 2

Comparison of Failure Rate

|  | Example 1 | Example 2 | Example 3 |
|---|---|---|---|
| Cracking during separation from the can | 4% | 2% | 2% |
| Cracking during separation in lamination direction | no separation | 4% | 3% |
| Capacity error of 30% or more | 2% | 3% | 3% |
| Total failure rate | 6% | 9% | 8% |

As shown in Table 2, the failure is increased slightly by separation in the lamination direction. However, mostly, such an increase is negligible from the viewpoint of production efficiency, considering the time for cleaning and preparation in the vacuum vessel, evacuation, cooling, the start of the film-forming components (the devices), and the like. Also, in Example 3, the increase of failure due to the separation in the lamination direction was small as in Example 2.

As described in Examples 2 and 3, when the mold releasing agent is applied to the surface of the laminate during lamination, the laminate can be divided by the surface, to which the mold releasing agent is applied, after all lamination is completed. Therefore, continuous lamination beyond the lamination unit of the product is possible, which improves the productivity significantly.

In the above examples, only the case where the fluorine-based material is used as the mold releasing agent is described. However, the present invention is not limited to this case. Other materials that provide the mold releasing effect can be used. In addition, as the method of applying the mold releasing agent, evaporation can be used other than sputtering and spraying as described in the examples. The applying method can be selected properly according to the process conditions including the material to be used.

In the above examples, the acrylate-based resin material is used as the insulating thin film material. However, other resin materials, such as vinyl-based and epoxy-based resins, ceramic-based materials, or metal oxide-based materials can be used as described above. For example, the effect of the present invention was confirmed in the case where a titanium oxide thin film that was formed by electron beam evaporation in an oxide atmosphere and has a thickness of 50 to 300 nm was used as the insulating thin film.

In the above examples, aluminum or copper is used for the metal thin film layer. However, other metals, such as silver, nickel, and zinc, or an alloy comprising these can be used. It is possible to use more than one type of metal thin film layer. For example, the metal thin film layers can comprise Al and Cu layers. This complements the properties, thereby achieving a high performance of electronic parts depending on the conditions.

In the above examples, the far-infrared ray heater or the electron beam is used as the means for removing the patterning material. However, the same effect can be obtained by other removing means, such as irradiation with an ultraviolet ray lamp and plasma irradiation.

In the above examples, the cylindrical can is used as the support. However, the present invention is no limited to this support. A support having the shape of a flat sheet or a curved surface can be used. In addition, a metal, an insulating material, a glass, a semiconductor or the like can be used as the material of the support. Electronic parts can be formed on these materials according to the present invention.

In the above examples, capacitors are illustrated as the electronic parts. However, the productivity of other electronic parts, such as chip coils and noise filters, can be improved by using the manufacturing method according to the present invention. That is, the present invention can be applied widely to methods for manufacturing electronic parts and apparatuses for manufacturing thin films.

The invention may be embodied in other forms without departing from the spirit or essential characteristics thereof. The embodiments disclosed in this application are to be considered in all respects as illustrative and not limitative, the scope of the invention is indicated by the appended claims rather than by the foregoing description, and all changes which come within the meaning and range of equivalency of the claims are intended to be embraced therein.

What is claimed is:

1. A method for manufacturing electronic parts, comprising the steps of:

forming about 1,000 or more thin films on a support to which a mold releasing agent has been previously applied to form a laminate; and separating the laminated thin film from the support.

2. The method for manufacturing electronic parts according to claim 1, wherein the application of the mold releasing agent is performed by a process selected from the group consisting of evaporation, spraying, sputtering, and a combination thereof.

3. The method for manufacturing electronic parts according to claim 1, wherein a plurality of the laminated thin films are laminated, and a mold releasing agent is applied to a surface of the laminated thin film during the lamination.

4. The method for manufacturing electronic parts according to claim 3, wherein the application of the mold releasing agent is performed by a process selected from the group consisting of evaporation, spraying, sputtering, and a combination thereof.

5. A method for manufacturing electronic parts having at least a metal thin film and an insulating thing film, comprising the steps of:

laminating about 1,000 or more of the metal thin films and about 1,000 or more of the insulating thin films on a support to form a laminate; and separating the laminate in a thickness direction.

6. The method for manufacturing electronic parts according to claim 5, wherein a mold releasing agent is applied after laminating a predetermined number of the metal thin films and the insulating thin films, and a predetermined number of the metal thin films and the insulating thin films are further laminated.

7. The method for manufacturing electronic parts according to claim 6, wherein the application of the mold releasing agent is performed by a process selected from the group consisting of evaporation, spraying, sputtering, and a combination thereof.

8. The method for manufacturing electronic parts according to claim 5, further comprising a step of applying a mold releasing agent to the support prior to the step of forming the laminate.

9. The method for manufacturing electronic parts according to claim 8, wherein the application of the mold releasing agent is performed by a process selected from the group consisting of evaporation, spraying, sputtering, and a combination thereof.

10. The method for manufacturing electronic parts according to claim 5, wherein the metal thin films and the insulating thin films are continuously formed without destroying a vacuum atmosphere under vacuum.

11. The method for manufacturing electronic parts according to claim 6, wherein the formation of the metal thin films and the insulating thin films and the application of the mold releasing agent are continuously performed without destroying a vacuum atmosphere under vacuum.

* * * * *